(12) United States Patent
Machida

(10) Patent No.: US 11,612,063 B2
(45) Date of Patent: Mar. 21, 2023

(54) METHOD OF MAKING INTERCONNECT SUBSTRATE AND INSULATING SHEET

(71) Applicant: SHINKO ELECTRIC INDUSTRIES CO., LTD., Nagano (JP)

(72) Inventor: Tomoaki Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 7 days.

(21) Appl. No.: 17/443,984

(22) Filed: Jul. 29, 2021

(65) Prior Publication Data
US 2022/0046805 A1 Feb. 10, 2022

(30) Foreign Application Priority Data
Aug. 6, 2020 (JP) .............................. JP2020-134086

(51) Int. Cl.
*H05K 3/28* (2006.01)
*H05K 3/42* (2006.01)

(52) U.S. Cl.
CPC ............. *H05K 3/288* (2013.01); *H05K 3/425* (2013.01); *H05K 2203/1383* (2013.01)

(58) Field of Classification Search
CPC ........... H05K 2203/1383; H05K 3/108; H05K 3/288; H05K 3/381; H05K 3/425; H05K 3/4673; H05K 3/28; H05K 3/42; H05K 3/00; H05K 3/18; H05K 3/26; H05K 3/46; H05K 1/056; H05K 3/382; H05K 3/44; H05K 3/4608; H05K 2201/09509; H05K 2201/09554; H05K 2201/0347; Y10T 29/49155
USPC ........................... 29/846; 174/257, 262, 264
See application file for complete search history.

(56) References Cited

U.S. PATENT DOCUMENTS

| 4,171,240 | A | * | 10/1979 | Wong ..................... H05K 3/288 |
| | | | | 216/87 |
| 4,487,654 | A | * | 12/1984 | Coppin .................. H05K 3/243 |
| | | | | 205/125 |
| 2004/0238209 | A1 | * | 12/2004 | Yuri ....................... H05K 1/056 |
| | | | | 174/262 |
| 2009/0288870 | A1 | | 11/2009 | Kondo et al. |
| 2018/0047661 | A1 | * | 2/2018 | Oshima ............... H01L 21/4857 |

FOREIGN PATENT DOCUMENTS

| JP | 3593351 B2 * 11/2004 | ............... H05K 3/46 |
| JP | 2010-010639 1/2010 | |
| JP | 2011171528 A * 9/2011 | ............... H05K 3/00 |

* cited by examiner

Primary Examiner — Timothy J Thompson
Assistant Examiner — Guillermo J Egoavil
(74) Attorney, Agent, or Firm — IPUSA, PLLC

(57) ABSTRACT

An insulating sheet for use in forming an insulating layer of an interconnect substrate includes a semi-cured insulating resin layer, a semi-cured protective resin layer laminated on an upper surface of the insulating resin layer, and a cover layer laminated on an upper surface of the protective resin layer, wherein the protective resin layer has lower resistance to a predetermined solution than the insulating resin layer has, the predetermined solution being capable of dissolving the insulating resin layer and/or the protective resin layer.

4 Claims, 4 Drawing Sheets

METHOD OF MAKING INTERCONNECT SUBSTRATE AND INSULATING SHEET

CROSS-REFERENCE TO RELATED APPLICATIONS

The present application is based upon and claims the benefit of priority from the prior Japanese Patent Application No. 2020-134086 filed on Aug. 6, 2020, with the Japanese Patent Office, the entire contents of which are incorporated herein by reference.

FIELD

The disclosures herein related to a method of making an interconnect substrate and an insulating sheet

BACKGROUND

A multilayer interconnect substrate as known in the art has interconnect layers and insulating layers alternately formed on a substrate. In a related-art method of making a multilayer interconnect substrate, a first interconnect layer is formed on a substrate, followed by successively forming an insulating layer and a protection layer on the first interconnect layer, for example. The protection layer is made of a material such as a PET film, a resist, a metal foil, or the like which is not removable by a predetermined solution used in a desmear process that will be described below.

Subsequently, via holes are formed through the protection layer and the insulating layer to reach the first interconnect layer. The protection layer is then used as a mask to perform a desmear process inside the via holes by use of a predetermined solution to remove residual resin inside the via holes. After the desmear process, the protection layer is removed.

The method of making an interconnect substrate noted above requires an additional step of removing the protection layer after the desmear process, which makes the process of making an interconnect substrate complex.

Accordingly, there may be a need to streamline a process of making an interconnect substrate.

RELATED-ART DOCUMENTS

Patent Document

[Patent Document 1] Japanese Laid-open Patent Publication No. 2010-010639

SUMMARY

According to an aspect of the embodiment, an insulating sheet for use in forming an insulating layer of an interconnect substrate includes a semi-cured insulating resin layer, a semi-cured protective resin layer laminated on an upper surface of the insulating resin layer, and a cover layer laminated on an upper surface of the protective resin layer, wherein the protective resin layer has lower resistance to a predetermined solution than the insulating resin layer has, the predetermined solution being capable of dissolving the insulating resin layer and/or the protective resin layer.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

In the following, a description will be given of a method of making an interconnect substrate according to a present embodiment. FIGS. 1A through 1C to FIGS. 4A through 4D are cross-sectional views illustrating an example of the method of making an interconnect substrate according to the present embodiment. In the step illustrated in FIG. 1A, an interconnect layer 20 having a predetermined pattern is formed on one surface of a substrate 10. In this example, the underlying layer on which the interconnect layer 20 is formed is the substrate 10 (e.g., glass-epoxy resin or the like). Alternatively, the underlying layer may be an insulating layer or the like formed on the substrate 10. The substrate 10 may be a rigid type or a flexible type. As a method of making the interconnect layer 20, a variety of methods of making interconnects such as a semi-additive method, which will be described later, may be used. Copper or the like may be used as the material of the interconnect layer 20.

Figure 1A:
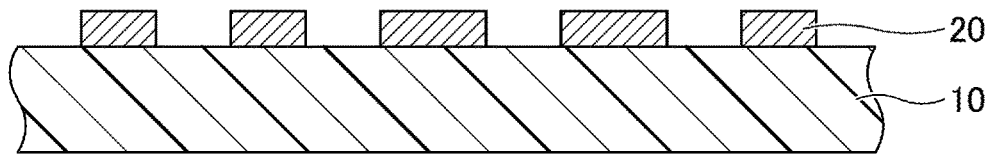
FIGS. 1A through 1C are cross-sectional views illustrating an example of a method of making an interconnect substrate according to an embodiment.
Figure 1B:
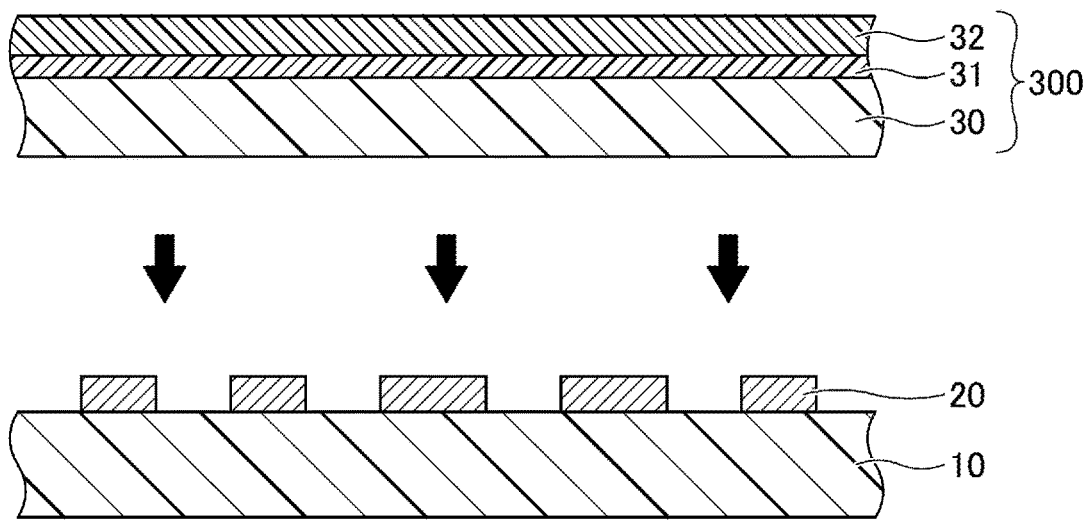

In the step illustrated in FIG. 1B, an insulating sheet 300 is prepared and disposed on one surface of the substrate 10 such as to cover the interconnect layer 20. The insulating sheet 300 is used to form an insulating layer of the interconnect substrate, and includes a semi-cured insulating resin layer 30, a semi-cured protective resin layer 31 laminated on the upper surface of the insulating resin layer 30, and a cover layer 32 laminated on the upper surface of the protective resin layer 31. The insulating sheet 300 is disposed on the substrate 10 such that the insulating resin layer 30 faces toward the substrate 10 serving as the underlying layer. It may be noted that another cover layer similar to the cover layer 32 may be disposed on the lower surface of the insulating resin layer 30. In such a case, the cover layer under the insulating resin layer 30 is removed before disposing the insulating sheet 300 on one surface of the substrate 10.

The thickness of the insulating resin layer 30 is approximately 20 micrometers to 45 micrometers, for example. The thickness of the protective resin layer 31 is thinner than the thickness of the insulating resin layer 30, and may approximately be 5 micrometers to 15 micrometers, for example. The thickness of the cover layer 32 may approximately be 30 micrometers to 40 micrometers, for example. Use of the protective resin layer 31 thinner than the insulating resin layer 30 provides an advantage in the control of surface roughness.

An insulating thermosetting resin such as an epoxy-type resin or a polyimide-type resin, for example, may be used as the material of the insulating resin layer 30. An insulating thermosetting resin such as an epoxy-type resin or a polyimide-type resin, for example, may be used as the material of the protective resin layer 31. The insulating resin layer 30 and the protective resin layer 31 may contain a filler such as silica. PET (polyethylene terephthalate) or the like may be used as the material of the cover layer 32. The cover layer 32 is provisionally bonded to the protective resin layer 31 such as to be easily peeled off from the protective resin layer 31.

The respective materials of the insulating resin layer 30 and the protective resin layer 31 are selected such that in the post curing state, the resistance of the protective resin layer 31 to a predetermined solution (i.e., desmear solution) used in the desmear step is lower than the resistance of the insulating resin layer 30 to the desmear solution. The desmear step is the one in which the remnants of the insulating resin layer 30 and/or the protective resin layer 31 are removed. In order to make the resistance of the protective resin layer 31 to the desmear solution lower than the resistance of the insulating resin layer 30 to the desmear solution, a material having a lower degree of polymerization than the insulating resin layer 30 may be selected as the material of the protective resin layer 31.

The insulating resin layer 30 and the protective resin layer 31 may be made of the same type of resin, or may be made of differing types of resin. From the viewpoint of an etching rate, however, the same type of resin is preferably used. In the case of using the same type of resin for the insulating resin layer 30 and the protective resin layer 31, the degree of polymerization may be adjusted by changing the composition of resin and the amount of filler. For example, an epoxy-type resin may be used for the insulating resin layer 30 and the protective resin layer 31, and the degree of polymerization may be adjusted by changing the composition of an epoxy-type resin and the amount of a filler.

Figure 1C:
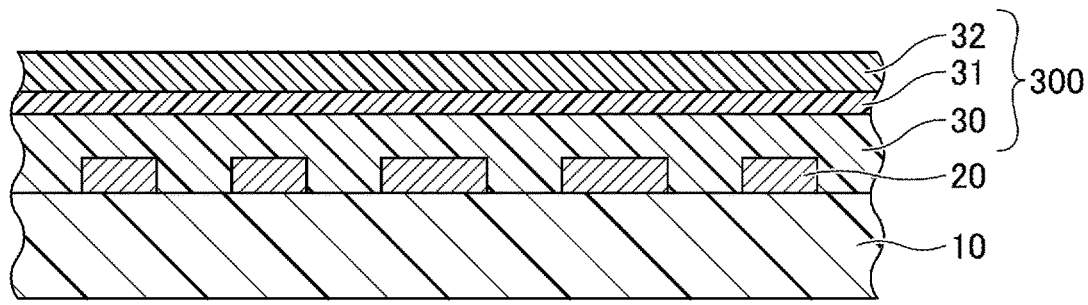

In the step illustrated in FIG. 1C, the insulating resin layer 30 and the protective resin layer 31 are heated and cured. The insulating resin layer 30 and the protective resin layer 31 may be heated and cured while being pressed against the substrate 10. With this arrangement, the resistance of the protective resin layer 31 to the desmear solution is made lower than the resistance of the insulating resin layer 30 to the desmear solution as was previously described.

Figure 2A:
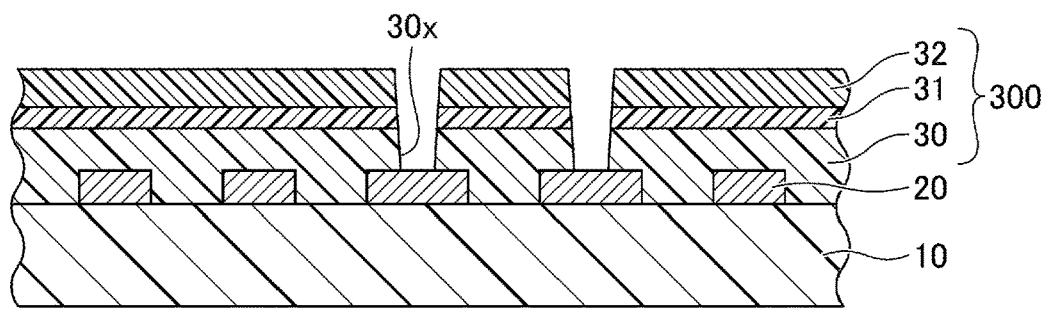
FIGS. 2A through 2C are cross-sectional views illustrating an example of the method of making the interconnect substrate according to the embodiment.

In the step illustrated in FIG. 2A, via holes 30x are formed through the insulating resin layer 30, the protective resin layer 31, and the cover layer 32 to expose the upper surface of the interconnect layer 20. The shape of the via holes 30x is a frustum of an inverted right circular cone for which the diameter of an opening of the hole at the upper surface of the cover layer 32 is greater than the diameter of a bottom opening of the hole at the upper surface of the interconnect layer 20, for example. The via holes 30x may be formed by a laser process utilizing carbon-dioxide gas laser or the like, for example. Alternatively, the via holes 30x may be formed by drilling or anisotropic dry etching (i.e., RIE process or the like).

Figure 2B:
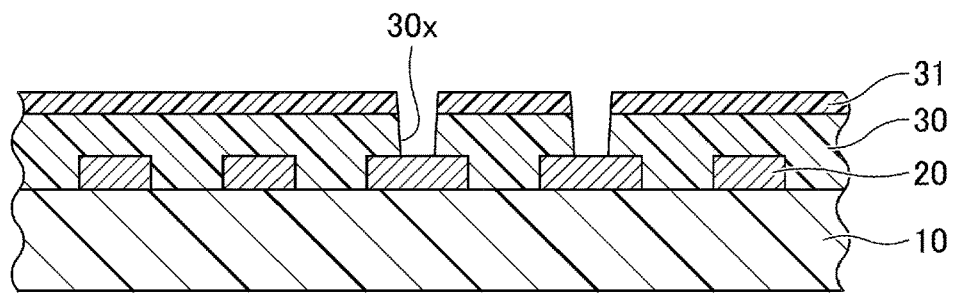

In the step illustrated in FIG. 2B, the cover layer 32 illustrated in FIG. 2A is removed (peeled) to expose the upper surface of the protective resin layer 31. Alternatively, the cover layer 32 may be removed to expose the upper surface of the protective resin layer 31 prior to the step illustrated in FIG. 2A. Namely, the removal of the cover layer 32 may be performed prior to the step of forming the via holes 30x or between the step of forming the via holes 30x and the step of removing residual resin which will be described below.

Figure 2C:
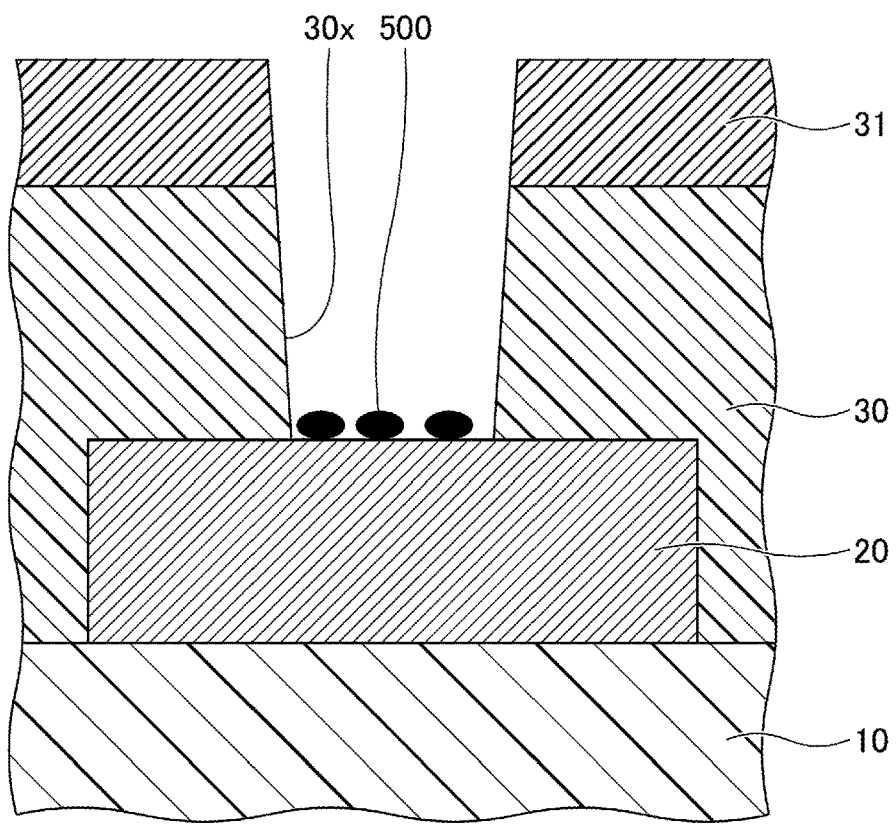

As illustrated in an enlarged view in FIG. 2C, when the via holes 30x are formed through the insulating resin layer 30, the protective resin layer 31, and the cover layer 32 to expose the upper surface of the interconnect layer 20, a resin residue 500 (i.e., the remnants of the insulating resin layer 30 and/or the protective resin layer 31) is left on the upper surface of the interconnect layer 20 exposed in the via holes 30x. In the next step, thus, a desmear process is performed to remove the resin residue 500.

Figure 3A:
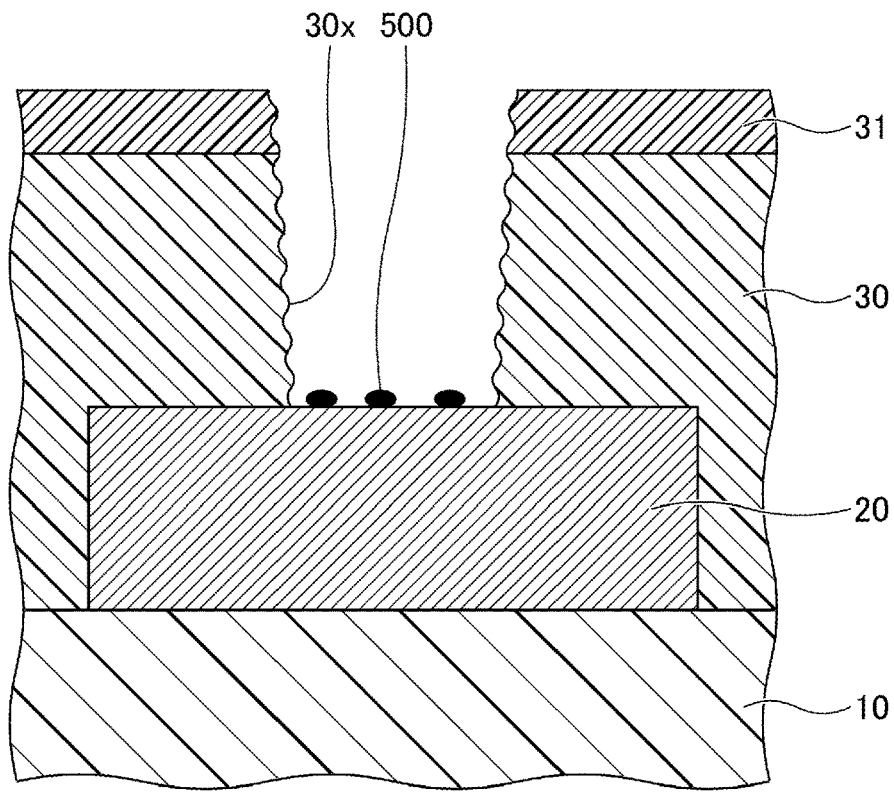
FIGS. 3A and 3B are cross-sectional views illustrating an example of the method of making the interconnect substrate according to the embodiment.
Figure 3B:
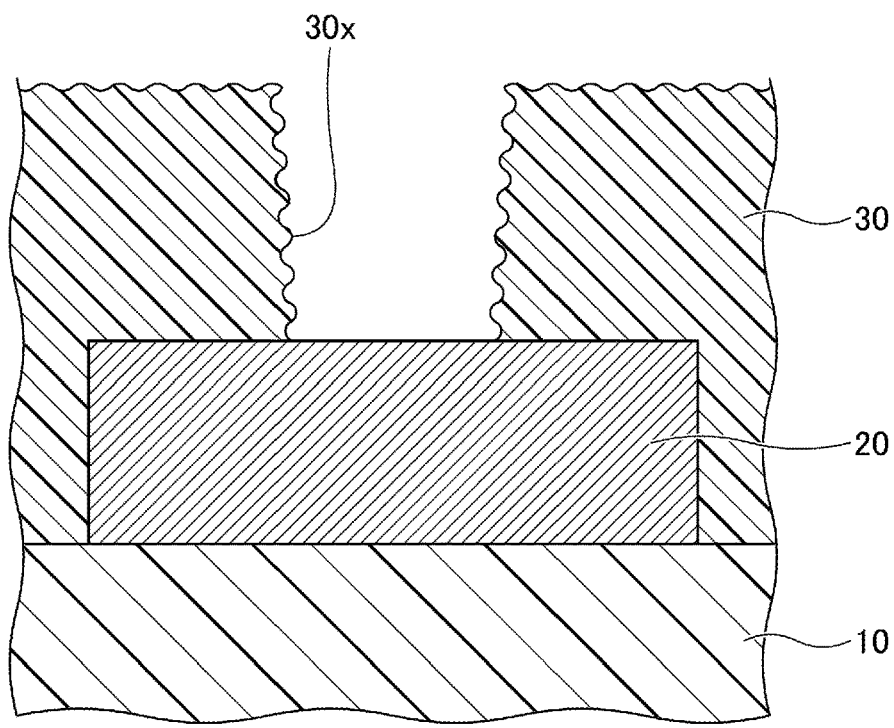

FIG. 3A and FIG. 3B illustrate the way the desmear process progresses in chronological order. The desmear process is performed by wet etching using a permanganate solution (as a preferred example, a potassium permanganate solution) or the like. As illustrated in FIG. 3A, the resin residue 500 is gradually removed by the desmear process. At the same time, the cured protective resin layer 31 is gradually dissolved to become thinner and thinner. Further, the inner wall surface of the via holes 30x becomes rough as a result of being roughened by the desmear process.

As the desmear process further progresses, the resin residue 500 is completely removed as illustrated in FIG. 3B. By this time, the cured protective resin layer 31 is completely dissolved, so that the upper surface of the cured insulating resin layer 30 is exposed. Further, the inner wall surface of the via holes 30x is further roughened by the desmear process to have a rougher surface than in FIG. 3A. The upper surface of the insulating resin layer 30 was covered with the protective resin layer 31 up to some point during the desmear process, so that the desmear process is applied to the upper surface of the insulating resin layer 30 after the protective resin layer 31 is completely dissolved. Namely, the time length of exposure to the desmear solution is shorter for the upper surface of the insulating resin layer 30 than for the inner wall surface of the via holes 30x. As a result, the roughness of the upper surface of the insulating resin layer 30 is less than the roughness of the inner wall surface of the via holes 30x after the desmear step. For example, the surface roughness Ra of the sidewall of the via holes 30x may be set to about 100 to 600 nanometers, and the surface roughness Ra of the upper surface of the insulating resin layer 30 may be set to about 10 to 200 nanometers.

Figure 4A:
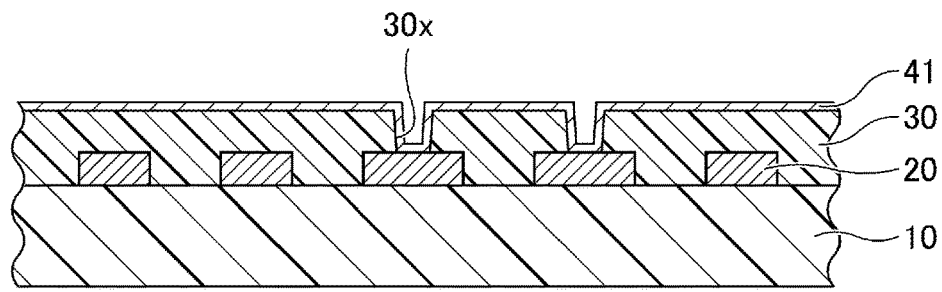
FIGS. 4A through 4D are cross-sectional views illustrating an example of the method of making the interconnect substrate according to the embodiment.

After the desmear process, an interconnect layer 40 is formed. In the following, a method of making the interconnect layer 40 by use of a semi-additive method, as an example, will be described. As illustrated in FIG. 4A, a seed layer 41 made of copper or the like is formed on the inner wall surface of the via holes 30x and on the upper surface of the insulating resin layer 30. The seed layer 41 may be formed by electroless plating or sputtering, for example.

As was previously described, the upper surface of the insulating resin layer 30 is moderately roughened (with the surface roughness Ra being 10 to 500 nanometers), so that the seed layer 41 exhibits an anchor effect to have sufficient adhesion to the upper surface of the insulating resin layer 30.

Figure 4B:
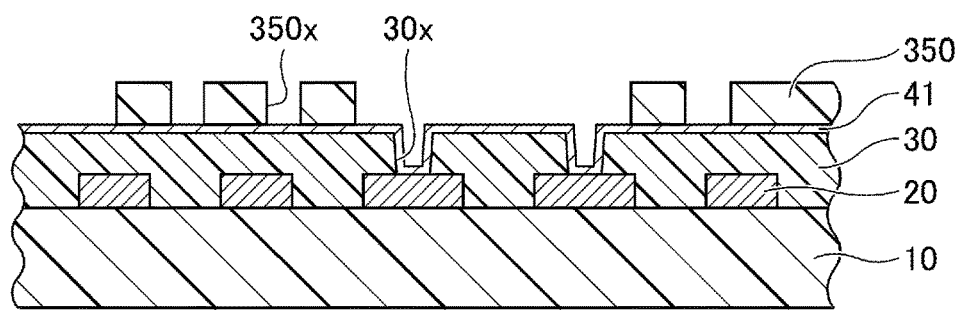

Subsequently in the step illustrated in FIG. 4B, a plating resist 350, having openings 350x at the positions where the interconnect layer 40 is to be disposed, is formed on the seed layer 41. The plating resist 350 may be formed by attaching a dry film resist, or by applying a liquid resist and using photolithography (exposure and development) to pattern the resist, for example.

Figure 4C:
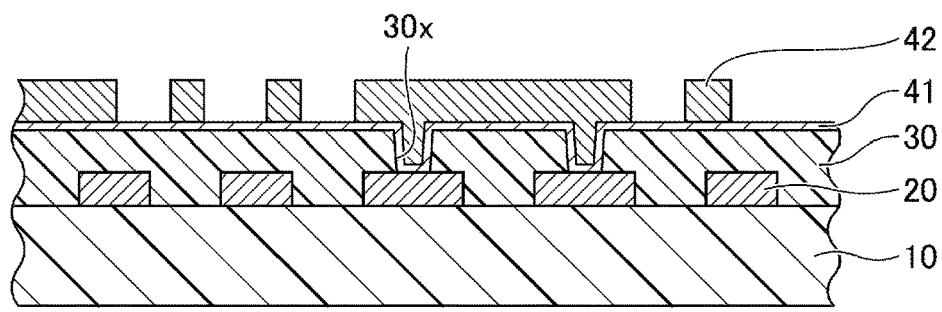

In the step illustrated in FIG. 4C, electroplating that utilizes the seed layer 41 as a plating-power feeding path is performed to form a metal plating layer 42 made of copper or the like from the inside of the via holes 30x to the openings 350x of the plating resist 350. The plating resist 350 is then removed to expose the seed layer 41.

Figure 4D:
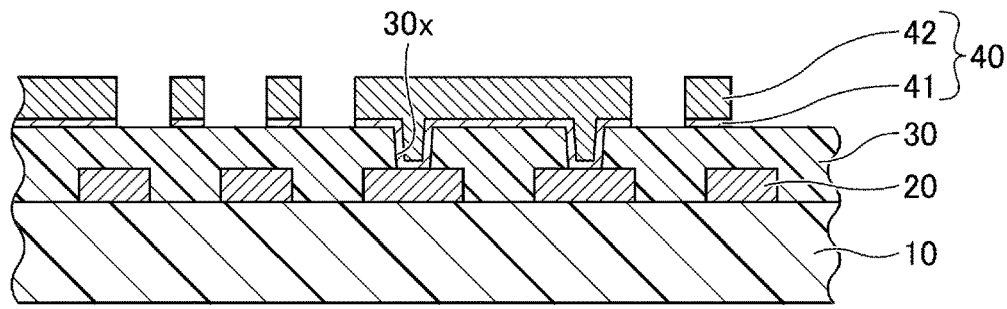

In the step illustrated in FIG. 4D, the metal plating layer 42 is used as a mask to etch unneeded portions of the seed layer 41. With this arrangement, the interconnect layer 40 including the seed layer 41 and the metal plating layer 42 laminated thereon is formed. A series of steps from the step of forming the interconnect layer 20 to the step of forming the interconnect layer 40 may be repeatedly performed to form n interconnect layers (n: an integer greater than or equal to 2) as appropriate.

The method of making an interconnect substrate according to the present embodiment as described above provides the protective resin layer 31 on the insulating resin layer 30 so as to enable the adjustment of, during one desmear process, a time length required to remove the resin residue 500 inside the via holes 30x and a time length during which the upper surface of the insulating resin layer 30 is roughened. As a result, the upper surface of the insulating resin layer 30 is provided with a desired roughness regardless of the time length required to remove the resin residue 500. Providing a desired roughness to the upper surface of the insulating resin layer 30 makes it possible to improve the adhesion to the interconnect layer 40. Further, the roughness of the upper surface of the insulating resin layer 30 may be reduced to improve the smoothness, which allows extremely fine interconnects (i.e., high density interconnect patterns) to be formed on the upper surface of the insulating resin layer 30. Since the protective resin layer 31 is completely dissolved during the step of a desmear process, there is no need to provide an additional step of removing the protective resin layer 31 after the desmear process. This streamlines the process of making an interconnect substrate.

Moreover, a sufficiently long time is allowed to be spent for removal of the resin residue 500, thereby enabling the complete removal of the resin residue 500 inside the via holes 30x. This arrangement can thus prevent connection failure that would be caused by the remnants of the resin residue 500, and prevent the occurrence of breaking of the seed layer 41 that would be caused by deposition failure in electroless copper plating during the step of forming the interconnect layer 40.

The disclosed technology enables the streamlining of a process of making an interconnect substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

One aspect of the subject-matter described herein is set out non-exclusively in the following numbered clauses:

1. A method of making an interconnect substrate, comprising:
preparing an insulating sheet that includes a semi-cured insulating resin layer, a semi-cured protective resin layer laminated on an upper surface of the insulating resin layer, and a cover layer laminated on an upper surface of the protective resin layer;
placing the insulating sheet on an underlying layer that has an interconnect layer formed thereon, such that the insulating resin layer faces toward the underlying layer, followed by curing the insulating resin layer and the protective resin layer;
forming a via hole through the insulating resin layer and the protective resin layer after being cured to expose an upper surface of the interconnect layer; and
removing a residue of the insulating resin layer and/or the protective resin layer inside the via hole by use of a predetermined solution after removal of the cover layer,
wherein the protective resin layer has lower resistance to the solution than the insulating resin layer has, and
wherein during the removing of the residue, the protective resin layer is dissolved to expose the upper surface of the insulating resin layer.

2. The method as recited in clause 1, wherein the insulating resin layer and the protective resin layer are made of thermosetting resin, and the protective resin layer has a lower degree of polymerization than the insulating resin layer has.

3. The method as recited in clause 1 or 2, wherein the protective resin layer is thinner than the insulating resin layer.

4. The method as recited in any one of clauses 1 to 3, wherein after the removing the residue, a roughness of the upper surface of the insulating resin layer is less than a roughness of an inner wall surface of the via hole.

5. The method as recited in any one of clauses 1 to 4, wherein the insulating resin layer and the protective resin layer are made of a same type of thermosetting resin, and have different compositions, and/or different amounts of filler, in the thermosetting resin.

6. The method as recited in any one of clauses 1 to 5, wherein the removal of the cover layer is performed prior to the forming the via hole or between the forming the via hole and the removing the residue.

What is claimed is:

1. An insulating sheet for use in forming an insulating layer of an interconnect substrate, comprising:
a semi-cured insulating resin layer;
a semi-cured protective resin layer laminated on an upper surface of the insulating resin layer; and
a removable cover layer laminated on an upper surface of the protective resin layer,
wherein a material of the insulating resin layer after being fully cured has first resistance against a predetermined solution, and a material of the protective resin layer after being fully cured has second resistance against the predetermined solution, the second resistance being lower than the first resistance, the predetermined solution being for dissolving remnants of the insulating resin layer and the protective resin layer when the remnants are generated by making a via hole through the insulating resin layer and the protective resin layer after the insulating resin layer and the protective resin layer are fully cured.

2. The insulating sheet as claimed in claim 1, wherein the insulating resin layer and the protective resin layer are made of thermosetting resin, and the protective resin layer has a lower degree of polymerization than the insulating resin layer has.

3. The insulating sheet as claimed in claim 1, wherein the protective resin layer is thinner than the insulating resin layer.

4. The insulating sheet as claimed in claim 1, wherein the insulating resin layer and the protective resin layer are made of a same type of resin, and have different compositions, and/or different amounts of filler, in the resin.

* * * * *